US012693336B2

(12) United States Patent
Konishi et al.

(10) Patent No.: US 12,693,336 B2
(45) Date of Patent: Jul. 28, 2026

(54) BATTERY MODEL CONSTRUCTION METHOD AND BATTERY DEGRADATION PREDICTION DEVICE

(71) Applicant: HONDA MOTOR CO., LTD., Tokyo (JP)

(72) Inventors: Shunsuke Konishi, Saitama (JP); Hidetoshi Utsumi, Saitama (JP); Takuma Kawahara, Saitama (JP); Hodaka Tsuge, Saitama (JP); Seiichi Koketsu, Saitama (JP)

(73) Assignee: HONDA MOTOR CO., LTD, Tokyo (JP)

( * ) Notice: Subject to any disclaimer, the term of this patent is extended or adjusted under 35 U.S.C. 154(b) by 1042 days.

(21) Appl. No.: 17/813,937

(22) Filed: Jul. 21, 2022

(65) Prior Publication Data

US 2023/0023044 A1     Jan. 26, 2023

(30) Foreign Application Priority Data

Jul. 26, 2021     (JP) ................................. 2021-121781

(51) Int. Cl.
| | |
|---|---|
| *G01R 31/367* | (2019.01) |
| *G01R 31/392* | (2019.01) |
| *G06F 30/27* | (2020.01) |

(52) U.S. Cl.
CPC ......... *G01R 31/367* (2019.01); *G01R 31/392* (2019.01); *G06F 30/27* (2020.01)

(58) Field of Classification Search
CPC ........ G06F 30/00; G06F 30/27; G06F 30/367; G06F 2111/08; G06F 2111/10;
(Continued)

(56) References Cited

U.S. PATENT DOCUMENTS

2021/0291698 A1     9/2021   Nishida

FOREIGN PATENT DOCUMENTS

WO     2020044713 A1     3/2020

OTHER PUBLICATIONS

Assefi, Mehdi et al., "Battery Degradation Temporal Modeling Using LSTM Networks", 2018, IEEE International Conference on Machine Learning and Applications, IEEE. (Year: 2018).*
(Continued)

*Primary Examiner* — Cedric Johnson
(74) *Attorney, Agent, or Firm* — CKC & PARTNERS CO., LLC

(57) ABSTRACT

A battery model construction method includes: a step ST2 for constructing a battery model; steps ST3 and ST4 for evaluating, for each sample battery, the prediction error between a measured value of the SOH and a predicted value according to the battery model, and determining whether there is inherent bias in the prediction error for each sample battery; steps ST5 and ST6 for constructing a first error prediction model associating explanatory variables defined on the basis of usage history parameters with an objective variable, and determining whether a first correlation exists between the measured value of the average prediction error acquired in steps ST3 and ST4 and the predicted value according to the first error prediction model; and a step ST7 for reconstructing the battery model in the case where it is determined that there is bias and that the first correlation exists in steps ST5 and ST6.

15 Claims, 10 Drawing Sheets

(58) Field of Classification Search
CPC ............. G06F 2119/04; G06F 2119/08; G01R
31/367; G01R 31/392; G01R 31/3842;
H01M 10/48; Y02E 60/10
USPC ...................................................... 703/18, 13
See application file for complete search history.

(56) References Cited

OTHER PUBLICATIONS

Hosen, Md Sazzad et al., "Battery Lifetime Prediction and Performance Assessment of Different Modeling Approaches", Feb. 19, 2021, iScience, Cell Press. (Year: 2021).*

Li, Weihan et al., "One-Shot Battery Degradation Trajectory Prediction with Deep Learning", Jun. 10, 2021, Journal of Power Sources 506, Elsevier B.V. (Year: 2021).*

Zhang, Wei et al., "Deep Learning-Based Prognostic Approach for Lithium-Ion Batteries with Adaptive Time-Series Prediction and On-line Validation", Jun. 2, 2020, Measurement 164, Elsevier Ltd. (Year: 2020).*

* cited by examiner

| BATTERY ID | SAMPLE MEAN | PARTIAL VARIANCE | STANDARD ERROR | 95% CONFIDENCE INTERVAL FOR POPULATION MEAN | | BIAS DETERMINATION |
|---|---|---|---|---|---|---|
| | | | | LOWER BOUND | UPPER BOUND | |
| 1 | ... | ... | ... | ... | ... | 有り |
| 2 | ... | ... | ... | ... | ... | 有り |
| 3 | ... | ... | ... | ... | ... | 無し |
| ... | ... | ... | ... | ... | ... | ... |
| ... | ... | ... | ... | ... | ... | ... |

SECOND CORRELATION
DETERMINATION PROCESS

PREPARE
SECOND ERROR TRAINING DATA — ST41

CONSTRUCT SECOND ERROR
PREDICTION MODEL USING
SECOND ERROR TRAINING DATA — ST42

EVALUATE STRENGTH OF SECOND
CORRELATION BETWEEN
MEASURED VALUE OF AVERAGE
PREDICTION ERROR AND
PREDICTED VALUE OF AVERAGE
PREDICTION ERROR ACCORDING
TO SECOND ERROR PREDICTION
MODEL — ST43

RETURN

FIG. 11

BATTERY MODEL CONSTRUCTION METHOD AND BATTERY DEGRADATION PREDICTION DEVICE

This application is based on and claims the benefit of priority from Japanese Patent Application No. 2021-121781, filed on 26 Jul. 2021, the content of which is incorporated herein by reference.

BACKGROUND OF THE INVENTION

Field of the Invention

The present disclosure relates to a battery model construction method and a battery degradation prediction device. More particularly, the present disclosure relates to a battery model construction method for constructing a battery model for calculating a predicted value of a battery degradation indicator, and a battery degradation prediction device that calculates a predicted value of a battery degradation indicator according to a battery model constructed according to the battery model construction method.

Related Art

Secondary batteries installed in electric vehicles, hybrid vehicles, and the like have the property of degrading with use. A secondary battery that is degraded is no longer capable of exhibiting adequate performance, and consequently it is necessary to slow the progress of degradation by taking appropriate measures according to how far the degradation has progressed. In addition, taking such measures for slowing the progress of degradation necessitates the accurate estimation of the degree of degradation in a secondary battery. For example, Patent Document 1 discloses a technology for estimating the degree of degradation in a secondary battery on the basis of usage history data (such as changes in the current, voltage, and temperature of the secondary battery and the lifetime to date, for example) that indicates how the secondary battery has been used. Moreover, since the degradation properties of a secondary battery are also correlated with data from the time of manufacture, in some cases the degree of degradation in a secondary battery is estimated on the basis of data from the time of manufacture of the secondary battery in addition to usage history data as described above.

Additionally, with regard to a battery model that estimates the degree of degradation in a secondary battery from usage history data and data from the time of manufacture, models other than a linear regression model have been proposed, such as regression models using a neural network, a gradient-boosted decision tree (hereinafter abbreviated as "GBDT"), or the like.

Patent Document 1: PCT International Publication No. WO2020/044713

SUMMARY OF THE INVENTION

Incidentally, it is difficult to raise the prediction accuracy of a linear regression model higher than a regression model based on a neural network, GBDT, or the like. In contrast, a regression model based on a neural network, GBDT, or the like has a complex structure compared to a linear regression model, which makes it difficult to identify how each factor in the usage history data, the data from the time of manufacture, and the like influences the predicted value. For this reason, tuning a regression model based on a neural network, GBDT, or the like so as to raise the prediction accuracy of an already-constructed model is difficult.

An objective of the present disclosure is to provide a battery model construction method and a battery degradation prediction device that can accurately predict battery degradation.

(1) A battery model construction method according to the present disclosure is a method for constructing a battery model associating values of a plurality of first input parameters and a plurality of second input parameters correlated with a degradation indicator for a battery with a predicted value of the degradation indicator, the battery model construction method including: a data acquiring step of acquiring data related to measured values of the first and second input parameters and the degradation indicator by using a plurality of sample batteries; a constructing step of constructing the battery model by using at least a portion of the data acquired in the data acquiring step as training data; an error trend determining step of evaluating, for each sample battery, a prediction error between the measured value of the degradation indicator and the predicted value of the degradation indicator according to the battery model, and determining whether there is inherent bias in the prediction error for each sample battery; a first correlation determining step of using the training data to construct a first error prediction model associating an explanatory variable defined on a basis of the first input parameters with an objective variable corresponding to a predicted value of the prediction error acquired in the error trend determining step, and determining whether a first correlation exists between the measured value of the prediction error and the predicted value of the prediction error according to the first error prediction model; and a first reconstruction step of reconstructing the battery model in the case where it is determined in the error trend determining step that there is the bias and it is determined in the first correlation determining step that the first correlation exists.

(2) In this case, preferably, the battery model construction method further includes: a second correlation determining step of using the training data to construct a second error prediction model associating an explanatory variable defined on a basis of the second input parameters with an objective variable corresponding to a predicted value of the prediction error acquired in the error trend determining step, and determining whether a second correlation exists between the measured value of the prediction error acquired in the error trend determining step and the predicted value of the prediction error according to the second error prediction model; and a second reconstruction step of reconstructing the battery model in the case where it is determined in the error trend determining step that there is the bias and it is determined in the second correlation determining step that the second correlation exists.

(3) In this case, preferably, the first input parameters are usage history parameters defined on a basis of time series data about a current, a voltage, and a temperature of the battery, and the second input parameters are manufacturing history parameters defined on a basis of data from a time of manufacture of the battery.

(4) In this case, preferably, in the first reconstruction step, the battery model is reconstructed by using the first error prediction model.

(5) In this case, preferably, in the second reconstruction step, the battery model is reconstructed by using the second error prediction model.

(6) In this case, preferably, the time series data related to measured values of the first and second input parameters and the degradation indicator acquired in the data acquiring step is divided into the training data that belongs to a prescribed training period and verification data that belongs to a verification period subsequent to the training period, and in the error trend determining step, the presence or absence of the bias is determined on a basis of an evaluation result, for each sample battery, regarding a distribution of the prediction error in the training period and an evaluation result regarding a correlation between the prediction error in the training period and the prediction error in the verification period.

(7) In this case, preferably, the battery model construction method further includes: a third reconstruction step of reconstructing the battery model by adding an offset term that outputs a constant value according to a cumulative use time of the battery in the case where it is determined in the error trend determining step that there is the bias and it is determined in the first and second correlation determining steps that neither the first nor the second correlation exists.

(8) A battery degradation prediction device according to the present disclosure includes: an input parameter value acquirer that acquires each value of a plurality of first input parameters and a plurality of second input parameters correlated with a degradation indicator for a battery; and a model predictor that calculates a predicted value of the degradation indicator by inputting the values of the first and second input parameters acquired by the input parameter value acquirer into a battery model constructed according to the battery model construction method according to any of (1) to (7).

(1) The battery model construction method according to the present disclosure includes: a constructing step of constructing a battery model using training data acquired by using a plurality of sample batteries; an error trend determining step of evaluating, for each sample battery, a prediction error between the measured value of the degradation indicator and the predicted value of the degradation indicator according to the battery model, and determining whether there is inherent bias in the prediction error for each sample battery; a first correlation determining step of constructing a first error prediction model associating an explanatory variable defined on a basis of the first input parameters with an objective variable corresponding to a predicted value of the prediction error, and determining whether a first correlation exists between the measured value of the prediction error and the predicted value of the prediction error according to the first error prediction model; and a first reconstruction step of reconstructing the battery model in the case where it is determined in the first correlation determining step that there is inherent bias in the prediction error for each sample battery and it is determined in the first correlation determining step that the first correlation exists. In the case where it is determined that there is inherent bias in the prediction error for each sample battery and that the first correlation exists, the cause of the bias in the prediction error for each sample battery is considered to be the first input parameter. In the present disclosure, by reconstructing the battery model through such an error trend determining step and first correlation determining step, the battery model can be reconstructed with higher prediction accuracy while also identifying the cause of the bias in the prediction error.

(2) The battery model construction method according to the present disclosure further includes: a second correlation determining step of constructing a second error prediction model associating an explanatory variable defined on a basis of the second input parameters with an objective variable corresponding to a predicted value of the prediction error, and determining whether a second correlation exists between the measured value of the prediction error acquired in the error trend determining step and the predicted value of the prediction error according to the second error prediction model; a second reconstruction step of reconstructing the battery model in the case where it is determined in the error trend determining step that there is inherent bias in the prediction error for each sample battery and it is determined in the second correlation determining step that the second correlation exists. In the case where it is determined that there is inherent bias in the prediction error for each sample battery and that the second correlation exists, the cause of the bias in the prediction error for each sample battery is considered to be the second input parameter. In the present disclosure, by reconstructing the battery model through such an error trend determining step and second correlation determining step, the battery model can be reconstructed with higher prediction accuracy while also identifying the cause of the bias in the prediction error.

(3) In the present disclosure, the first input parameters are usage history parameters defined on a basis of time series data about a current, a voltage, and a temperature of the battery, and the second input parameters are manufacturing history parameters defined on a basis of data from a time of manufacture of the battery. With this arrangement, according to the present disclosure, the cause of the bias in the prediction error for each sample battery can be identified while distinguishing between usage history parameters and manufacturing history parameters, and consequently the battery model can be reconstructed with higher prediction accuracy while also appropriately identifying the cause of the bias in the prediction error.

(4) In the present disclosure, in the first reconstruction step, the battery model is reconstructed by using the first error prediction model in the case where it is determined that there is inherent bias in the prediction error for each sample battery and that the first correlation exists. With this arrangement, the battery model can be reconstructed such that the bias in the prediction error for each sample battery is reduced, or in other words, such that the prediction accuracy is raised.

(5) In the present disclosure, in the second reconstruction step, the battery model is reconstructed by using the second error prediction model in the case where it is determined that there is inherent bias in the prediction error for each sample battery and that the second correlation exists. With this arrangement, the battery model can be reconstructed such that the bias in the prediction error for each sample battery is reduced, or in other words, such that the prediction accuracy is raised.

(6) In the present disclosure, in the error trend determining step, the presence or absence of inherent bias in the prediction error for each sample battery is determined on a basis of an evaluation result, for each sample battery, regarding a distribution of the prediction error in the training period and an evaluation result regarding a correlation between the prediction error in the training period and the prediction error in the verification period. With this arrangement, the presence or absence of inherent bias in the prediction error for each sample battery can be determined accurately, and as a result, a battery model with high prediction accuracy can be constructed.

(7) The battery model construction method according to the present disclosure further includes: a third reconstruction step of reconstructing the battery model by adding an offset term that outputs a constant value according to a cumulative use time of the battery in the case where it is determined in the error trend determining step that there is bias in the prediction error and it is determined in the first and second correlation determining steps that neither the first nor the second correlation exists. Here, in the case where it is determined that there is bias in the prediction error and that neither the first correlation nor the second correlation exists, the cause of the bias in the prediction error is considered to be some kind of input parameter other than the first and second input parameters not accounted for by the battery model. In the present disclosure, by reconstructing the battery model by adding an offset term in such a case, the prediction accuracy of the battery model can be improved without adding a new input parameter.

(8) The battery degradation prediction device according to the present disclosure includes: an input parameter value acquirer that acquires values of a plurality of first and second input parameters; and a model predictor that calculates a predicted value of the degradation indicator for a battery by inputting the values of the first and second input parameters acquired by the input parameter value acquirer into a battery model constructed according to the battery model construction method described above. According to the present disclosure, the degradation trend of a battery currently in use can be predicted accurately.

BRIEF DESCRIPTION OF THE DRAWINGS

FIG. 11 is a diagram schematically illustrating a configuration of a second error prediction model and second error training data.

DETAILED DESCRIPTION OF THE INVENTION

Hereinafter, a battery degradation prediction device according to an embodiment of the present disclosure and a method for constructing a battery model used in the battery degradation prediction device will be described with reference to the drawings.

Figure 1:
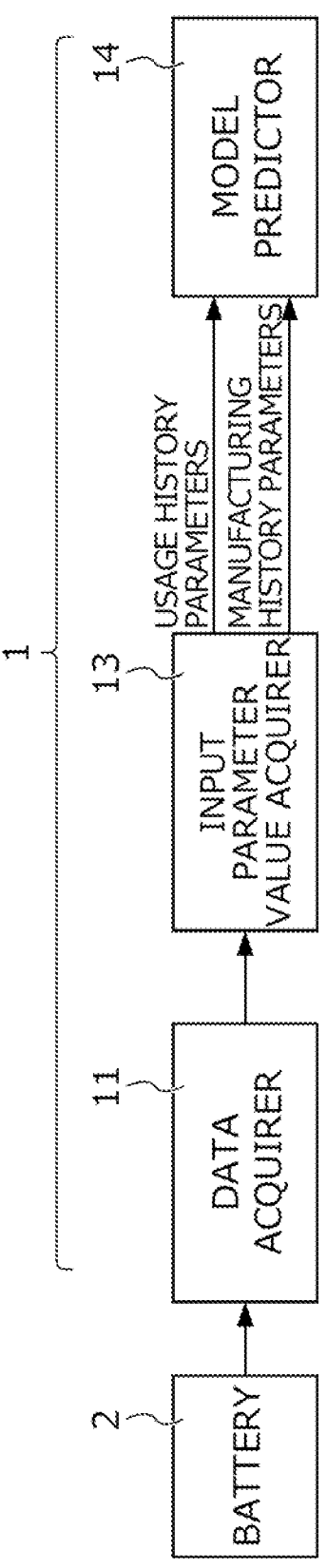
FIG. 1 is a diagram illustrating a configuration of a battery degradation prediction device according to an embodiment of the present disclosure.

FIG. 1 is a diagram illustrating a configuration of a battery degradation prediction device 1 according to the embodiment. The battery degradation prediction device 1 predicts the degree of degradation in a battery 2 on the basis of time series data about the current, voltage, and temperature of the battery 2 and data from the time of manufacture of the battery 2. Hereinafter, a case will be described in which the battery degradation prediction device 1 is installed in an electric vehicle (not illustrated) that is driven using electric power from the battery 2 and predicts the degree of degradation in the battery 2 onboard the electric vehicle, but the present disclosure is not limited to the above. Some or all of the components of the battery degradation prediction device 1 may also be implemented by a server communicably connected to the electric vehicle.

The battery 2 is a secondary battery that can both be discharged, in which chemical energy is converted into electrical energy, and be charged, in which electrical energy is converted into chemical energy. The following describes a case where a battery that is charged and discharged by the movement of lithium ions between electrodes, commonly referred to as a lithium-ion battery, is used as the battery 2, but the present disclosure is not limited thereto. The battery 2 is connected to an electrical load (not illustrated) including an inverter, drive motor, and the like, and is charged and discharged with respect to the electrical load.

The battery degradation prediction device 1 is a computer implemented by hardware including, for instance, a computational processor such as a CPU, secondary storage such as an HDD or an SSD storing various programs, and primary storage such as RAM for storing data temporarily need in the execution of the programs by the computational processor. With a hardware configuration like the above, various functions such as a data acquirer 11, an input parameter value acquirer 13, and a model predictor 14 are achieved in the battery degradation prediction device 1.

The data acquirer 11 acquires time series data about the current, voltage, and temperature of the battery 2 on the basis of the output from a battery sensor (not illustrated) provided in the battery 2.

The input parameter value acquirer 13 acquires the values of a plurality of input parameters correlated with a degradation indicator for the battery 2 on the basis of the time series data about the current, voltage, and temperature acquired by the data acquirer 11 and data from the time of manufacture of the battery 2 stored in a storage medium not illustrated, and inputs the values of the input parameters into the model predictor 14.

As illustrated in FIG. 1, the plurality of input parameters defined in the input parameter value acquirer 13 include a plurality of usage history parameters defined on the basis of the time series data about the current, voltage, and temperature acquired by the data acquirer 11 and a plurality of manufacturing history parameters defined on the basis of the data from the time of manufacture of the battery 2. The input parameter value acquirer 13 calculates the values of the usage history parameters above on a prescribed period on the basis of the time series data about the current, voltage, and temperature acquired by the data acquirer 11, and inputs the values of the usage history parameters and the manufacturing history parameters into the model predictor 14. The following describes a case where the calculation period for the usage history parameters in the input parameter value acquirer 13 is set to two weeks, but the present disclosure is not limited thereto.

The manufacturing history parameters herein include material property values for each of a plurality of materials used in the manufacture of the battery 2, manufacturing process data value that characterizes the manufacturing process of the battery 2, inspection values from various inspections carried out with respect to the battery 2, and the like. In other words, unlike the usage history parameters, the manufacturing history parameters are basically static values that do not change over time.

Figure 2:
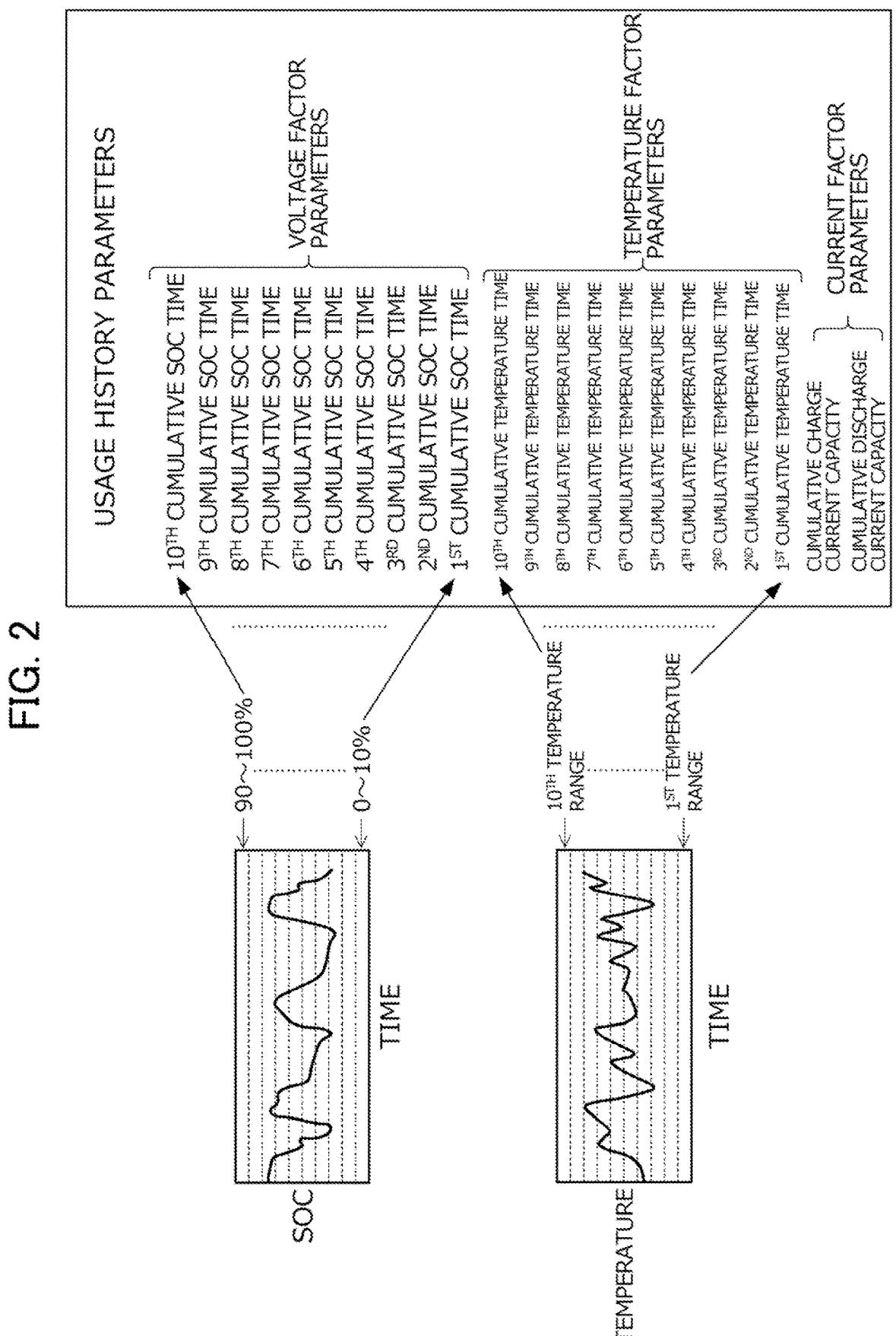
FIG. 2 is a diagram schematically illustrating a configuration of a plurality of usage history parameters.

FIG. 2 is a diagram schematically illustrating the configuration of the plurality of usage history parameters defined in the input parameter value acquirer 13. As illustrated in FIG. 2, the plurality of usage history parameters includes a plurality of voltage factor parameters, a plurality of temperature factor parameters, and a plurality of current factor parameters.

A voltage factor parameter refers to a parameter that treats the voltage of the battery 2 as a factor. In other words, a voltage factor parameter is a parameter most highly correlated with voltage from among the current, voltage, and temperature of the battery 2. In the present embodiment, the integral values of specific intervals of the time spent within a prescribed range of the state of charge (SOC), which is approximately proportional to the discharge voltage of the battery 2, are defined as the voltage factor parameters. More specifically, a first cumulative SOC time is the integral value of the specific interval of the time that the SOC of the battery 2 has spent in the range from 0 to 10[%], a second cumulative SOC time is the integral value of the specific interval of the time that the SOC of the battery 2 has spent in the range from 10 to 20[%], a third cumulative SOC time is the integral value of the specific interval of the time that the SOC of the battery 2 has spent in the range from 20 to 30 [%], a fourth cumulative SOC time is the integral value of the specific interval of the time that the SOC of the battery 2 has spent in the range from 30 to 40[%], a fifth cumulative SOC time is the integral value of the specific interval of the time that the SOC of the battery 2 has spent in the range from 40 to 50[%], a sixth cumulative SOC time is the integral value of the specific interval of the time that the SOC of the battery 2 has spent in the range from 50 to 60[%], a seventh cumulative SOC time is the integral value of the specific interval of the time that the SOC of the battery 2 has spent in the range from 60 to 70[%], an eighth cumulative SOC time is the integral value of the specific interval of the time that the SOC of the battery 2 has spent in the range from 70 to 80[%], a ninth cumulative SOC time is the integral value of the specific interval of the time that the SOC of the battery 2 has spent in the range from 80 to 90[%], and a tenth cumulative SOC time is the integral value of the specific interval of the time that the SOC of the battery 2 has spent in the range from 90 to 100[%].

A temperature factor parameter refers to a parameter that treats the temperature of the battery 2 as a factor. In other words, a temperature factor parameter is a parameter most highly correlated with temperature from among the current, voltage, and temperature of the battery 2. In the present embodiment, the operating temperature range of the battery 2 is divided into 10 equal ranges, and the integral values of specific intervals of the time that the temperature of the battery 2 spends within each of the temperature ranges are defined as the temperature factor parameters. More specifically, a first cumulative temperature time is the integral value of the specific interval of the time that the temperature of the battery 2 has spent in the first temperature range, a second cumulative temperature time is the integral value of the specific interval of the time that the temperature of the battery 2 has spent in the second temperature range, the second temperature range being higher than the first temperature range, a third cumulative temperature time is the integral value of the specific interval of the time that the temperature of the battery 2 has spent in the third temperature range, the third temperature range being higher than the second temperature range, a fourth cumulative temperature time is the integral value of the specific interval of the time that the temperature of the battery 2 has spent in the fourth temperature range, the fourth temperature range being higher than the third temperature range, a fifth cumulative temperature time is the integral value of the specific interval of the time that the temperature of the battery 2 has spent in the fifth temperature range, the fifth temperature range being higher than the fourth temperature range, a sixth cumulative temperature time is the integral value of the specific interval of the time that the temperature of the battery 2 has spent in the sixth temperature range, the sixth temperature range being higher than the fifth temperature range, a seventh cumulative temperature time is the integral value of the specific interval of the time that the temperature of the battery 2 has spent in the seventh temperature range, the seventh temperature range being higher than the sixth temperature range, an eighth cumulative temperature time is the integral value of the specific interval of the time that the temperature of the battery 2 has spent in the eighth temperature range, the eighth temperature range being higher than the seventh temperature range, a ninth cumulative temperature time is the integral value of the specific interval of the time that the temperature of the battery 2 has spent in the ninth temperature range, the ninth temperature range being higher than the eighth temperature range, and a tenth cumulative temperature time is the integral value of the specific interval of the time that the temperature of the battery 2 has spent in the tenth temperature range, the tenth temperature range being higher than the ninth temperature range.

A current factor parameter refers to a parameter that treats the current of the battery 2 as a factor. In other words, a current factor parameter is a parameter most highly correlated with current from among the current, voltage, and temperature of the battery 2. In the present embodiment, the cumulative charge current capacity, which is the integral value over a specific interval of the product of the charge current of the battery 2 and the time, and the cumulative discharge current capacity, which is the integral value over a specific interval of the product of the discharge current of the battery 2 and the time, are defined as the current factor parameters. As above, the present embodiment describes a case where integral values of the product of the current and time are defined as the current factor parameters, but the present disclosure is not limited thereto. For example, the number of charge-discharge cycles, which corresponds to the number of times the battery 2 has switched between charging and discharging, may also be defined as a current factor parameter.

Returning to FIG. 1, the input parameter value acquirer 13 calculates the values of the plurality of usage history parameters configured as above on a prescribed period on the basis of the time series data transmitted from the data acquirer 11, and inputs the values of the usage history parameters and the manufacturing history parameters into the model predictor 14.

The model predictor 14 includes a battery model that treats the plurality of input parameters including the above-described plurality of usage history parameters and manufacturing history parameters as explanatory variables, and associates the explanatory variables with an objective variable, namely, a predicted value of a degradation indicator for the battery 2. By inputting the values of the plurality of input parameters inputted from the input parameter value acquirer 13 into the battery model, a predicted value of the degradation indicator for the battery 2 is calculated. The present embodiment describes a case where the state of health (SOH), which indicates the ratio of the full charge capacity [Ah] in the degraded state relative to the initial full charge capacity of the battery 2 defined as 100%, is used as the degradation indicator for the battery 2, but the present disclosure is not limited thereto. A model constructed according to the battery model construction method described later with reference to FIG. 3 and the like is used for the battery model here.

Figure 3:
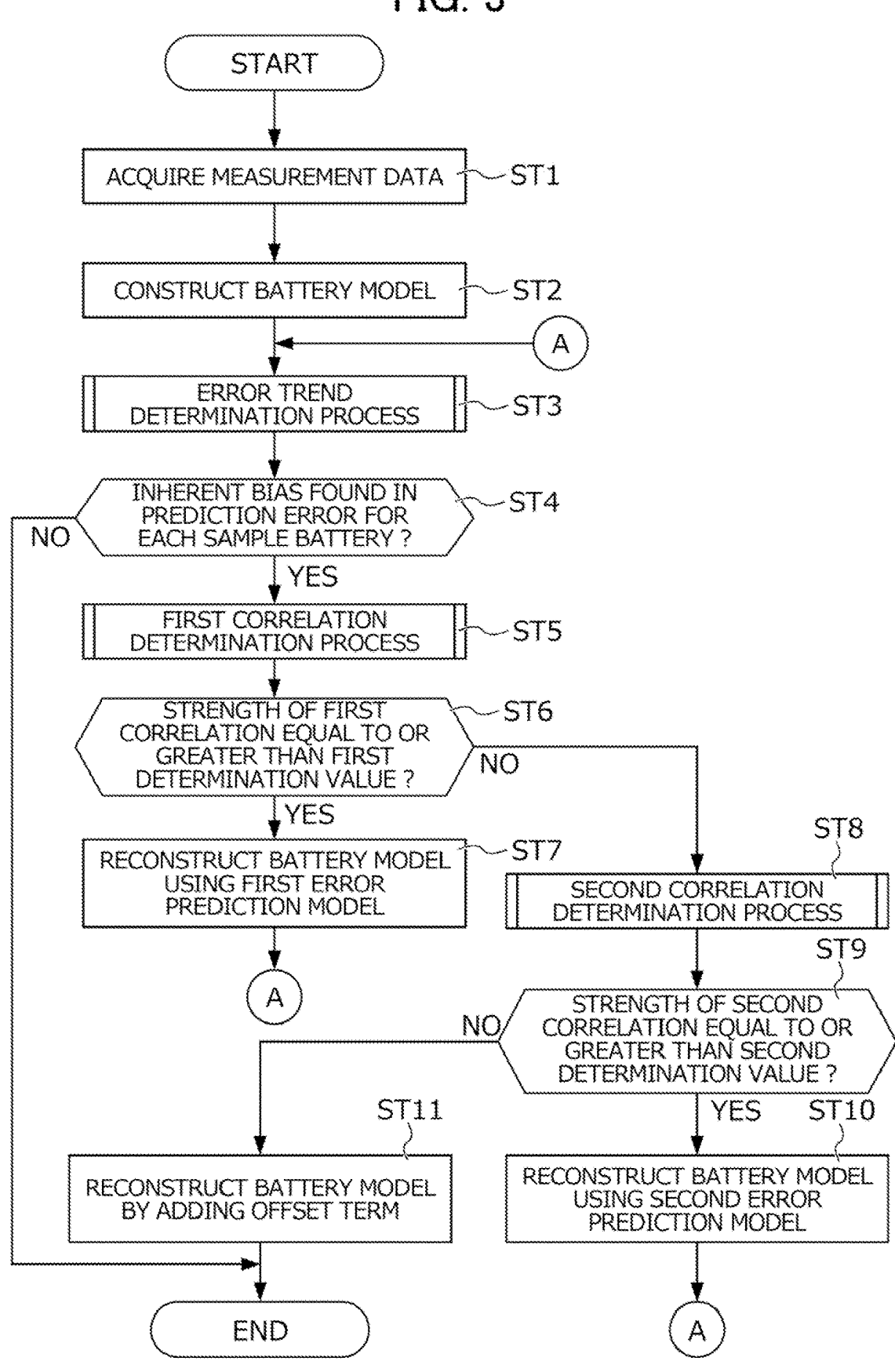
FIG. 3 is a flowchart illustrating a specific procedure of a battery model construction method.

Next, a method for constructing a battery model by a computer will be described. FIG. 3 is a flowchart illustrating a specific procedure of the battery model construction method according to the present embodiment.

First, in step ST1, the designer of the battery model uses a plurality (on the order of several hundred, for example) of sample batteries with individually assigned IDs over a prescribed measurement period (for example, 66 weeks) and thereby acquires time series data of measured values for the plurality of usage history parameters and the SOH for each sample battery as well as measured values for the plurality of manufacturing history parameters for each sample battery, and causes time series data about these usage history parameters, manufacturing history parameters, and SOH over the measurement period (hereinafter also collectively referred to as the "measurement data") to be stored in a storage medium in association with the individual IDs. Note that the measurement data over the measurement period acquired in step ST1 is divided into training data belonging to a prescribed training period (from week 2 to week 60, for example) and verification data belonging to a verification period (from week 62 to week 66, for example) subsequent to the training period.

Next, in step ST2, the designer uses the training data acquired in step ST1 to construct, on the basis of a known model construction method, a battery model that treats the plurality of usage history parameters and the plurality of manufacturing history parameters as explanatory variables and the predicted value of SOH as the objective variable. Note that the battery model may be constructed on the basis of a linear regression model or on the basis of a neural network, GBDT, or the like.

Next, in step ST3, the designer executes an error trend determination process that evaluates the prediction error between the measured value of the SOH and the predicted value of the SOH according to the battery model for each sample battery and determines whether there is inherent bias in the prediction error for each sample battery, and then proceeds to step ST4.

Figure 4:
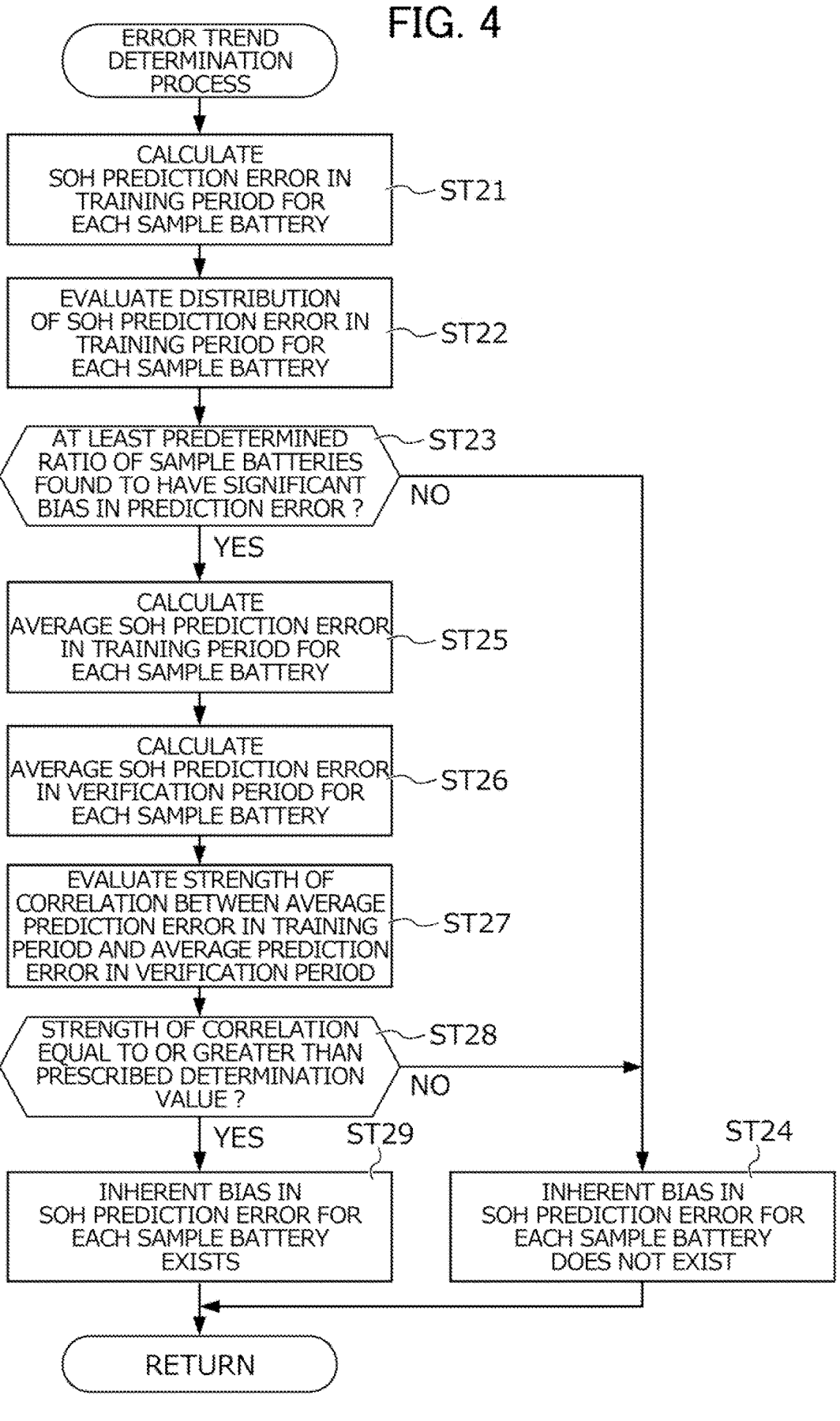
FIG. 4 is a flowchart illustrating a specific procedure of an error trend determination process.

FIG. 4 is a flowchart illustrating a specific procedure of the error trend determination process. First, in step ST21, the designer uses the training data and the battery model to calculate the SOH prediction error in the training period for each sample battery. Here, the SOH prediction error in the training period is calculated by subtracting, from the predicted value of the SOH included in the training data, the predicted value of the SOH obtained by inputting the values of the plurality of usage history parameters and the plurality of manufacturing history parameters included in the training data into the battery model (see FIG. 5).

Figures 5, 6:
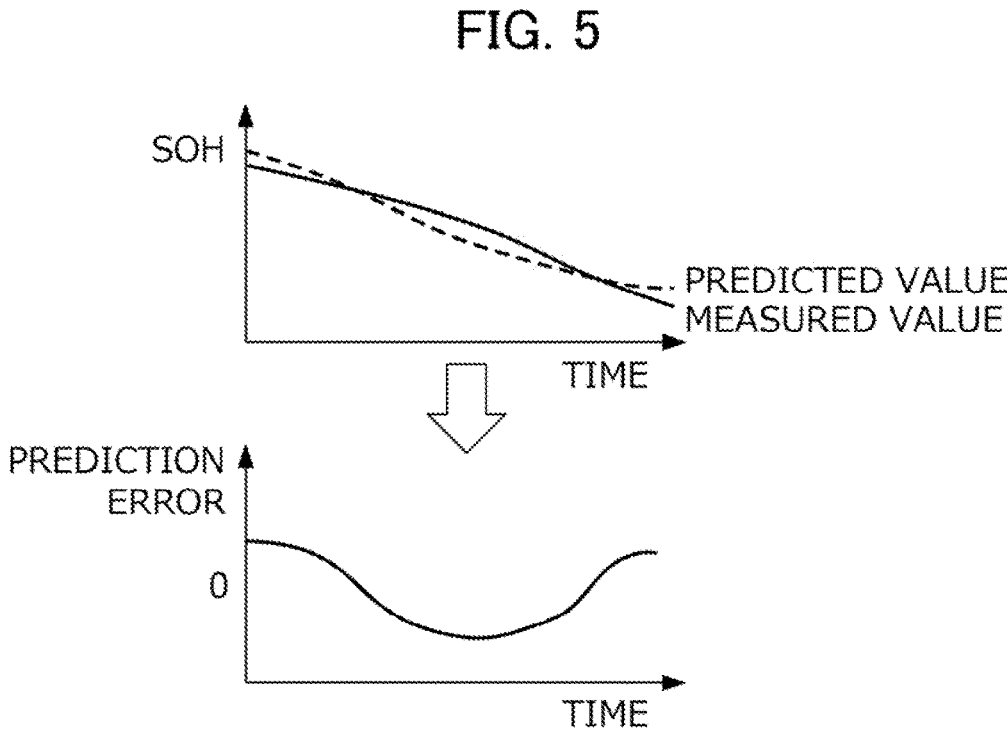
FIG. 5 is a diagram schematically illustrating SOH prediction error.
FIG. 6 is a table illustrating an example of evaluation results regarding a distribution of SOH prediction error within a training period.

Next, in step ST22, the designer uses the prediction error calculation results from step ST21 to evaluate the distribution of the SOH prediction error in the training period for each sample battery. More specifically, the designer uses the calculation results from step ST21 to calculate the sample mean, partial variance, standard error, and the 95% confidence interval for the population mean with respect to the SOH prediction error for each sample battery as illustrated in FIG. 6, and evaluates whether there is significant bias in the SOH prediction error in the training period for each sample battery. Here, the determination of whether or not there is significant bias in the SOH prediction error can be made by evaluating the positions of the calculated upper and lower bounds of the 95% confidence interval for the population mean with respect to the zero point. More specifically, if the upper and lower bounds of the 95% confidence interval for the population mean are both less than or equal to the zero point, or both equal to or greater than the zero point, it can be determined with 95% confidence that there is significant bias in the SOH prediction error.

Next, in step ST23, the designer refers to the evaluation results from step ST22 and determines whether or not at least a prescribed ratio (for example, 90%) of the entire sample battery population is found to have significant bias in the SOH prediction error in the training period.

If the determination result in step ST23 is NO, the designer determines that there is no significant bias in the SOH prediction error according to the battery model for each sample battery (step ST24), and proceeds to step ST4 in FIG. 3. On the other hand, if the determination result in step ST23 is YES, the designer proceeds to step ST25.

In step ST25, the designer uses the computational results from step ST21 to calculate the average value of the SOH prediction error in the training period for each sample battery.

In step ST26, the designer uses the verification data and the battery model to calculate the average value of the SOH prediction error in the verification period for each sample battery. Here, the SOH prediction error in the verification period is calculated by subtracting, from the measured value of the SOH included in the verification data, the predicted value of the SOH obtained by inputting the values of the plurality of usage history parameters and the plurality of manufacturing history parameters included in the verification data into the battery model. Also, in step ST26, these computational results of the SOH prediction error in the verification period are used to calculate the average value of the SOH prediction error in the verification period for each sample battery.

In step ST27, the designer uses the computational results from steps ST25 and ST26 to calculate a parameter expressing the strength of the correlation between the average SOH prediction error in the training period and the average SOH prediction error in the verification period subsequent to the training period. The present embodiment describes a case where the coefficient of determination (hereinafter abbreviated as "$R^2$") is used as the parameter expressing the strength of the correlation between two parameters, but the present disclosure is not limited thereto.

In step ST28, the designer refers to the evaluation results from step ST27 and determines whether the strength of the correlation between the average prediction error in the training period and the average prediction error in the verification period is equal to or greater than a prescribed determination value. In the case of evaluating the strength of the correlation with $R^2$ as described above, the determination value is set to 0.49, for example.

If the determination result in step ST28 is NO, the designer determines that there is no significant bias in the SOH prediction error according to the battery model for each sample battery (see step ST24), and proceeds to step ST4 in FIG. 3. On the other hand, if the determination result in step ST28 is YES, the designer determines that there is inherent bias in the SOH prediction error according to the battery model for each sample battery (see step ST29), and proceeds to step ST4 in FIG. 3.

Figure 7:
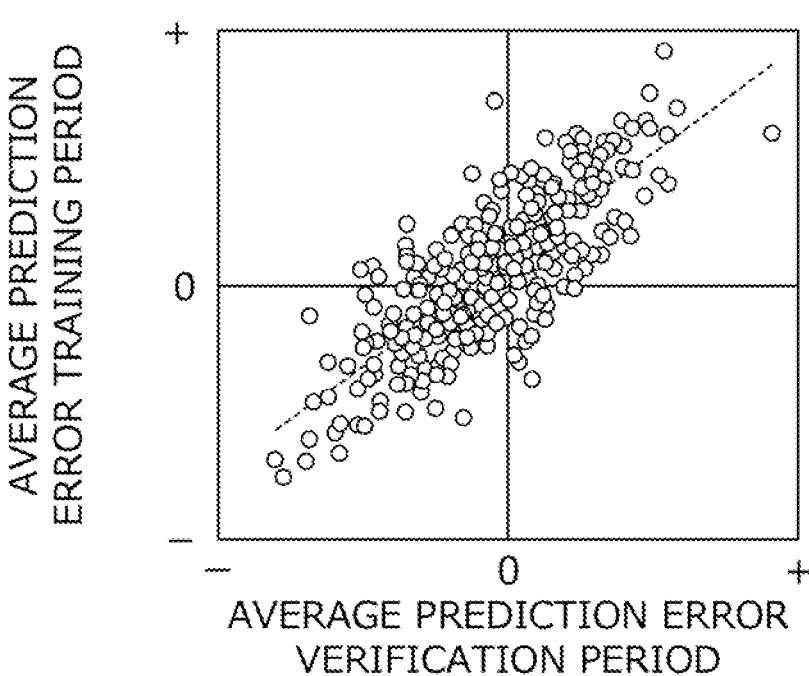
FIG. 7 is a graph illustrating the average prediction error for respective sample batteries plotted on a plane of which the vertical axis is the average prediction error in a training period and the horizontal axis is the average prediction error in a verification period ($R^2 \approx 0.64$)

FIG. 7 is a graph illustrating the average prediction error for respective sample batteries plotted on a plane of which the vertical axis is the average prediction error in a training period and the horizontal axis is the average prediction error in a verification period. Note that FIG. 7 illustrates an example in which a strong correlation ($R^2 \approx 0.64$) is found to exist between the average prediction errors. As illustrated in FIG. 7, the stronger the correlation is, the closer the distribution of the average prediction error approaches a straight line having a prescribed slope indicated by the dashed line.

In the error trend determination process as above, the presence or absence of inherent bias in the SOH prediction error for each sample battery is determined on the basis of the evaluation results regarding the distribution of the prediction error in the training period for each sample battery (see step ST21) and the evaluation results regarding the correlation between the average prediction error in the training period and the average prediction error in the verification period (see step ST27).

Returning to FIG. 3, in step ST4, the designer reviews the results of executing the error trend determination process and determines whether there is inherent bias in the SOH prediction error for each sample battery. If the determination result in step ST4 is NO, the designer determines that there is no further room for improvement in the created battery model, and ends the process illustrated in FIG. 3. On the other hand, if the determination result in step ST4 is YES, the designer identifies the cause of the bias in the prediction error and proceeds to step ST5.

Next, in step ST5, the designer executes a first correlation determination process for determining whether the bias in the prediction error is due to a usage history parameter, and proceeds to step ST6.

FIG. 3 is a flowchart illustrating a specific procedure of the first correlation determination process. First, in step ST31, the designer prepares first error training data for constructing a first error prediction model described later.

Figure 9:
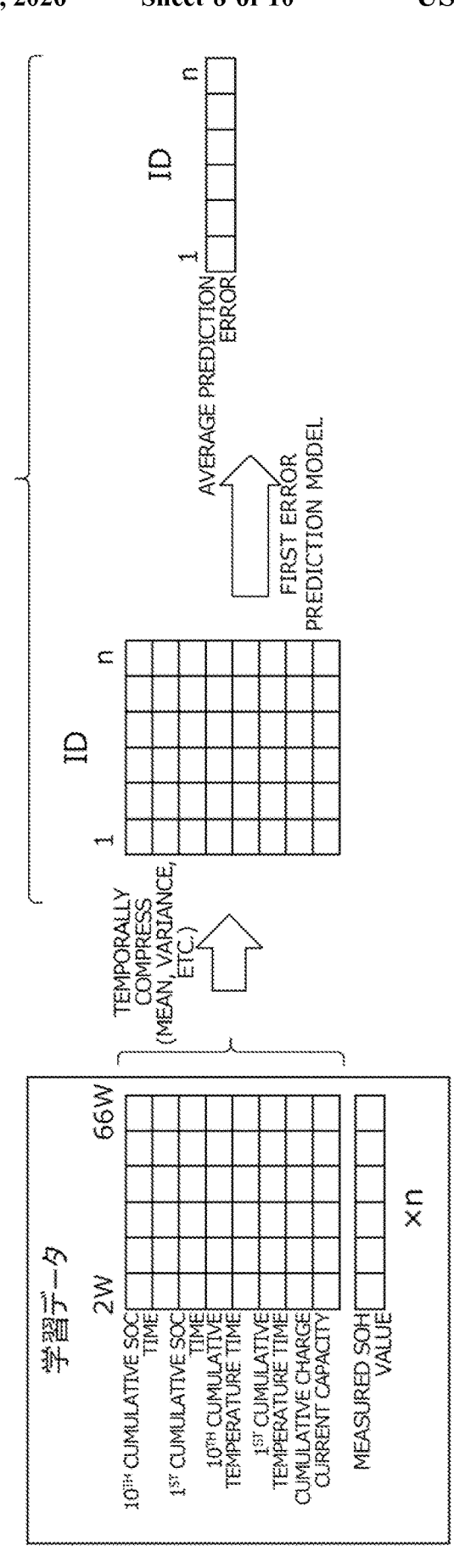
FIG. 9 is a diagram schematically illustrating a configuration of a first error prediction model and first error training data.

FIG. 9 is a diagram schematically illustrating a configuration of the first error prediction model and the first error training data. As illustrated in FIG. 9, the first error prediction model is a regression model that treats a plurality of compressed usage history parameters defined on the basis of a plurality of usage history parameters as explanatory variables, treats a predicted value of the average SOH prediction error as an objective variable, and associates the explanatory variables with the objective variable. Consequently, in step ST31, the first error training data is generated by combining input data, which includes the values of a plurality of compressed usage history parameters defined on the basis of time series data throughout the training period for a plurality of usage history parameters from among the training data acquired in step ST1, with output data, which includes the measured values of the average SOH prediction error in the training period calculated for each sample battery in step ST25. Here, the compressed usage history parameters are each defined by the mean, variance, or the like of each usage history parameter over the training period as an integral value of a specific interval as described above, for example.

Figure 8:
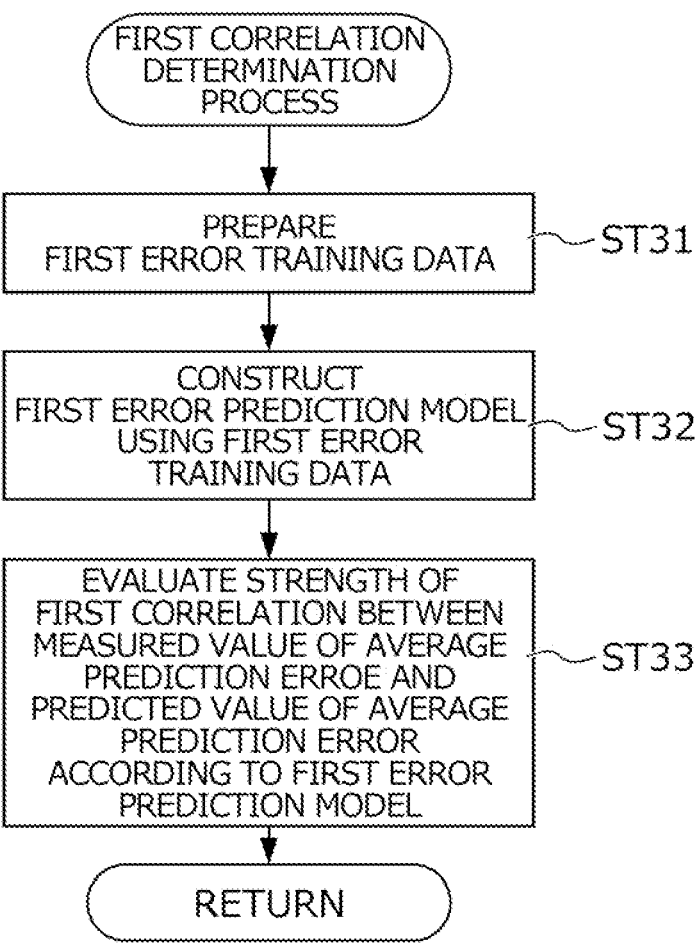
FIG. 8 is a flowchart illustrating a specific procedure of a first correlation determination process.

Returning to FIG. 8, in step ST32, the designer uses the first error training data prepared in step ST31 to construct, on the basis of a known model construction method, a first error prediction model that associates explanatory variables, namely the plurality of compressed usage history parameters, with an objective variable, namely the predicted value of the average prediction error. Note that the first error prediction model may be constructed on the basis of a linear regression model or on the basis of a neural network, GBDT, or the like.

Next, in step ST33, the designer calculates a parameter (in the present embodiment, the coefficient of determination $R^2$ as described above) expressing the strength of a first correlation between the measured values of the average SOH prediction error included in the first error training data prepared in step ST31 and the predicted value of the average SOH prediction error obtained by inputting the first error training data into the first error prediction model constructed in step ST32, and then proceeds to step ST6 in FIG. 3.

Returning to FIG. 3, in step ST6, the designer refers to the evaluation result regarding the first correlation in step ST33 and determines whether the strength of the first correlation is equal to or greater than a prescribed first determination value. In the case of evaluating the strength of the correlation with the coefficient of determination $R^2$ as described above, the first determination value is set to 0.49, for example. Here, the case where the strength of the first correlation is equal to or greater than the first determination value means that the prediction error included in the battery model can be predicted by the first error prediction model of which the input is the same plurality of usage history parameters as a portion of the input into the battery model. Consequently, the case where the strength of the first correlation is equal to or greater than the first determination value means that the cause of the bias in the prediction error lies in the usage history parameters, and thus the battery model can be reconstructed to resolve the bias in the SOH prediction error by reconsidering the input type of usage history parameters among the input types for the battery model. In contrast, the case where the strength of the first correlation is less than the first determination value means that the cause of the bias in the prediction error does not lie in the usage history parameters, and thus the bias in the prediction error cannot be resolved even if the input type of usage history parameters among the input types for the battery model is reconsidered.

Consequently, if the determination result in step ST6 is NO, the designer proceeds to step ST8, whereas if the determination result in step ST6 is YES, the designer proceeds to step ST7.

In step ST7, the designer reconstructs the battery model by reconsidering the input type of usage history parameters among the input types for the battery model in accordance with the determination that there is bias in the prediction error and the determination that the first correlation is equal to or greater than the first determination value. After that, the designer returns to step ST3. More specifically, a new battery model is reconstructed by combining the battery model from before reconstruction with the first error prediction model constructed in the first correlation determination process of step ST5. Namely, the battery model is reconstructed such that the output from the battery model from before reconstruction and the output from the first error prediction model are added together.

Next, in step ST8, the designer executes a second correlation determination process for determining whether the bias in the prediction error is due to a manufacturing history parameter, and proceeds to step ST9.

Figure 10:
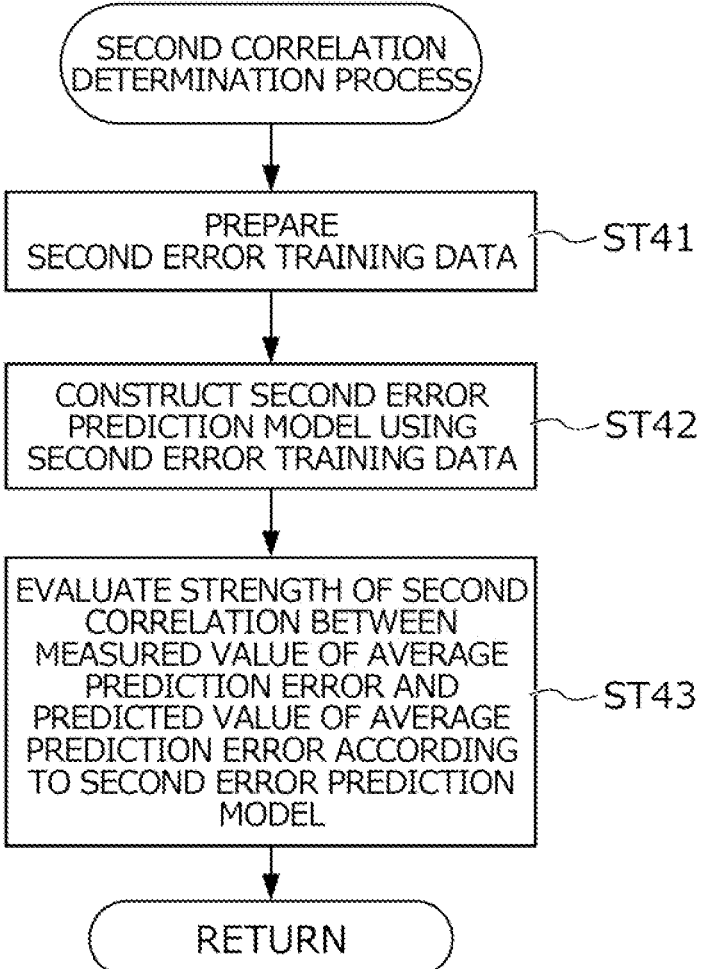
FIG. 10 is a flowchart illustrating a specific procedure of a second correlation determination process.

FIG. 10 is a flowchart illustrating a specific procedure of the second correlation determination process. First, in step ST41, the designer prepares second error training data for constructing a second error prediction model described later.

Figure 11:
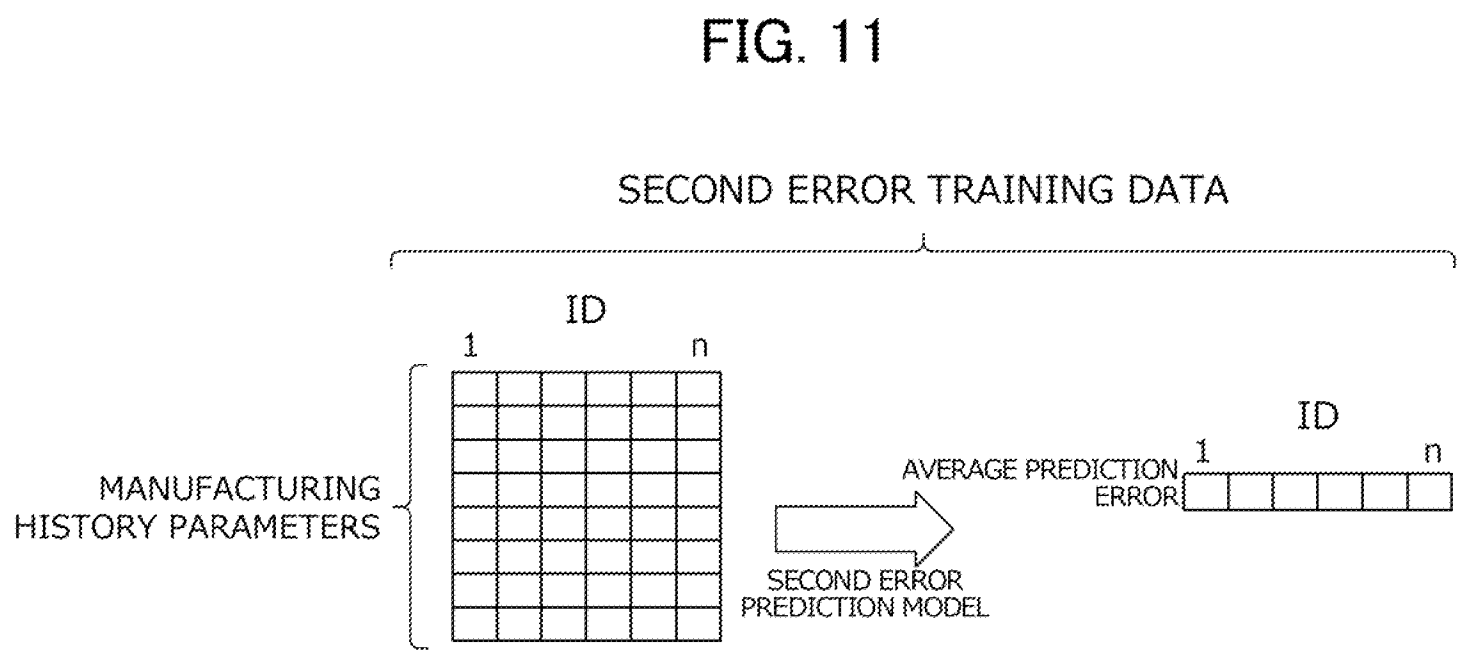

FIG. 11 is a diagram schematically illustrating a configuration of the second error prediction model and the second error training data. As illustrated in FIG. 11, the second error prediction model is a regression model that treats a plurality of manufacturing history parameters as explanatory variables, treats a predicted value of the average SOH prediction error as an objective variable, and associates the explanatory variables with the objective variable. In other words, the second error prediction model has different inputs than the first error prediction model described above. Consequently, in step ST41, the second error training data is generated by combining input data, which includes the values of a plurality of manufacturing history parameters from among the training data acquired in step ST1, with output data, which includes the measured values of the average SOH prediction error in the training period calculated for each sample battery in step ST25.

Returning to FIG. 10, in step ST42, the designer uses the second error training data prepared in step ST41 to construct, on the basis of a known model construction method, a second error prediction model that associates explanatory variables, namely the plurality of manufacturing history parameters, with an objective variable, namely the predicted value of the average prediction error. Note that: the second error prediction model may be constructed on the basis of a linear regression model or on the basis of a neural network, GBDT, or the like.

Next, in step ST43, the designer calculates a parameter (in the present embodiment, the coefficient of determination $R^2$ as described above) expressing the strength of a second correlation between the measured values of the average SOH prediction error included in the second error training data prepared in step ST41 and the predicted value of the average SOH prediction error obtained by inputting the second error training data into the second error prediction model constructed in step ST42, and then proceeds to step ST9 in FIG. 3.

Returning to FIG. 3, in step ST9, the designer refers to the evaluation result regarding the second correlation in step ST43 and determines whether the strength of the second correlation is equal to or greater than a prescribed second determination value. In the case of evaluating the strength of the second correlation with the coefficient of determination $R^2$ as described above, the second determination value is set to 0.49, for example. Here, the case where the strength of the second correlation is equal to or greater than the second determination value means that the prediction error included in the battery model can be predicted by the second error prediction model of which the input is the same plurality of manufacturing history parameters as a portion of the input into the battery model. Consequently, the case where the strength of the second correlation is equal to or greater than the second determination value means that the cause of the bias in the prediction error lies in the manufacturing history parameters, and thus the battery model can be reconstructed to resolve the bias in the SOH prediction error by reconsidering the input type of manufacturing history parameters among the input types for the battery model. In contrast, the case where the strength of the second correlation is less than the second determination value means that the cause of the bias in the prediction error does not lie in the manufacturing history parameters, and thus the bias in the prediction error cannot be resolved even if the input type of manufacturing history parameters among the input types for the battery model is reconsidered.

Consequently, if the determination result in step ST9 is YES, the designer proceeds to step ST10. In step ST10, the designer reconstructs the battery model by reconsidering the input type of manufacturing history parameters among the input types for the battery model in accordance with the determination that there is bias in the prediction error and the determination that the second correlation is equal to or greater than the second determination value. After that, the designer returns to step ST3. More specifically, a new battery model is reconstructed by combining the battery model from before reconstruction with the second error prediction model constructed in the second correlation determination process of step ST8. Namely, the battery model is reconstructed such that the output from the battery model from before reconstruction and the output from the second error prediction model are added together.

On the other hand, if the determination result in step ST9 is NO, or in other words, if it is determined that there is bias in the prediction error and the strengths of the first and second correlations are both less than the first and second determination values, the designer proceeds to step ST11. In this case, the cause of the bias in the prediction error is considered to be some kind of input parameter other than the usage history parameters and the manufacturing history parameters not accounted for by the battery model. Accordingly, in step ST11, the designer reconstructs the battery model by adding an offset term that outputs a constant value according to the cumulative use time of the battery to the battery model from before reconstruction, and then ends the process illustrated in FIG. 3. Here, the average value across all sample batteries of the average SOH prediction error calculated for each sample battery in steps ST25 and ST26 can be used as the constant value according to the cumulative use time, for example.

According to the battery model construction method and battery degradation prediction device 1 according to the present embodiment, the following effects are achieved.

(1) The battery model construction method according to the present embodiment includes: a constructing step ST2 of constructing a battery model using training data acquired by using a plurality of sample batteries; error trend determining steps ST3 and ST4 for evaluating, for each sample battery, the prediction error between the measured value of the SOH and the predicted value of the SOH according to the battery model, and determining whether there is inherent bias in the prediction error for each sample battery; first correlation determining steps ST5 and ST6 for constructing a first error prediction model that treats compressed usage history parameters generated by temporally compressing the usage history parameters as explanatory variables and treats the predicted value of the average SOH prediction error as the objective variable, and determining whether the strength of a first correlation between the measured value of the average prediction error and the predicted value of the average prediction error according to the first error prediction model is equal to or greater than a first determination value; and a first reconstructing step ST7 for reconstructing the battery model in the case where it is determined that there is inherent bias in the prediction error for each sample battery in the error trend determining steps ST3 and ST4 and that the strength of the first correlation is equal to or greater than the first determination value in the first correlation determining steps ST5 and ST6. In the case where it is determined that there is inherent bias in the prediction error for each sample battery and that the strength of the first correlation is equal to or greater than the first determination value, the cause of the bias in the prediction error for each sample battery is considered to be the usage history parameters. In the present embodiment, by reconstructing the battery model through such error trend determining steps ST3 to ST4 and first correlation determining steps ST5 to ST6, the battery model can be reconstructed with higher prediction accuracy while also identifying the cause of the bias in the prediction error.

(2) The battery model construction method according to the present embodiment further includes: second correlation determining steps ST8 and ST9 for constructing a second error prediction model that treats manufacturing history parameters as explanatory variables and treats the predicted value of the average prediction error as the objective variable, and determining whether the strength of a second correlation between the measured value of the average prediction error acquired in the error trend determining steps ST3 and ST4 and the predicted value of the average prediction error according to the second error prediction model is equal to or greater than a second determination value; and a second reconstructing step ST10 for reconstructing the battery model in the case where it is determined that there is inherent bias in the prediction error for each sample battery in the error trend determining steps ST3 and ST4 and that the strength of the second correlation is equal to or greater than the second determination value in the second correlation determining steps ST8 and ST9. In the case where it is determined that there is inherent bias in the prediction error for each sample battery and that the strength of the second correlation is equal to or greater than the second determination value, the cause of the bias in the prediction error for each sample battery is considered to be the manufacturing history parameters. In the present embodiment, by reconstructing the battery model through such error trend determining steps ST3 to ST4 and second correlation determining steps ST8 to ST9, the battery model can be reconstructed with higher prediction accuracy while also identifying the cause of the bias in the prediction error.

(3) In the present embodiment, in the first correlation determining steps ST5 and ST6, it is determined whether the bias in the prediction error is due to the usage history parameters, and in the second correlation determining steps ST8 and ST9, it is determined whether the bias in the prediction error is due to the manufacturing history parameters. With this arrangement, according to the present embodiment, the cause of the bias in the prediction error for each sample battery can be identified while distinguishing between usage history parameters and manufacturing history parameters, and consequently the battery model can be reconstructed with higher prediction accuracy while also appropriately identifying the cause of the bias in the prediction error.

(4) In the first reconstructing step ST7, the battery model is reconstructed by using the first error prediction model in the case where it is determined that there is inherent bias in the prediction error for each sample battery and that the strength of the first correlation is equal to or greater than the first determination value. With this arrangement, the battery model can be reconstructed such that the bias in the prediction error for each sample battery is reduced, or in other words, such that the prediction accuracy is raised.

(5) In the second reconstructing step ST10, the battery model is reconstructed by using the second error prediction model in the case where it is determined that there is inherent bias in the prediction error for each sample battery and that the strength of the second correlation is equal to or greater than the second determination value. With this arrangement, the battery model can be reconstructed such that the bias in the prediction error for each sample battery is reduced, or in other words, such that the prediction accuracy is raised.

(6) In the error trend determining steps ST3 and ST4, the presence or absence of inherent bias in the prediction error for each sample battery is determined on a basis of an evaluation result, for each sample battery, regarding a distribution of the prediction error in the training period and an evaluation result regarding the correlation between the average prediction error in the training period and the average prediction error in the verification period. With this arrangement, the presence or absence of inherent bias in the prediction error for each sample battery can be determined accurately, and as a result, a battery model with high prediction accuracy can be constructed.

(7) The battery model construction method further includes: a third reconstructing step ST11 for reconstructing the battery model by adding an offset term that outputs a constant value according to the cumulative use time of the battery to the battery model from before reconstruction in the case where it is determined that there is bias in the prediction error in the error trend determining steps ST3 and ST4 and that the first and the second correlations are both less than the first and second determination values in the first and second correlation determining steps ST5, ST6, ST8, and ST9. Here, in the case where it is determined that there is bias in the prediction error and that the strengths of the first and second correlations are both less than the first and second determination values, the cause of the bias in the prediction error is considered to be some kind of input parameter other than the usage history parameters and manufacturing history parameters not accounted for by the battery model. In the present embodiment, by reconstructing the battery model by adding an offset term to the battery model from before reconstruction in such a case, the prediction accuracy of the battery model can be improved without adding a new input parameter.

(8) The battery degradation prediction device 1 according to the present embodiment includes: the input parameter value acquirer 13 that acquires a plurality of usage history parameters and a plurality of manufacturing history parameters; and the model predictor 14 that calculates a predicted value of the SOH of the battery 2 by inputting the values of the usage history parameters and manufacturing history parameters acquired by the input parameter value acquirer 13 into a battery model constructed according to the battery model construction method described above. According to the present embodiment, the degradation trend of the battery 2 currently in use can be predicted accurately.

The foregoing describes an embodiment of the present disclosure, but the present disclosure is not limited thereto. The particulars of the configuration may be modified as appropriate within the scope of the present disclosure.

What is claimed is:

1. A battery model construction method for constructing a battery model associating values of a plurality of first input parameters and a plurality of second input parameters correlated with a degradation indicator for a battery with a predicted value of the degradation indicator, the battery model construction method comprising:

a data acquiring step of acquiring data related to measured values of the first and second input parameters and the degradation indicator by using a plurality of sample batteries;

a constructing step of constructing the battery model by using at least a portion of the data acquired in the data acquiring step as training data;

an error trend determining step of evaluating, for each sample battery, a prediction error between the measured value of the degradation indicator and the predicted value of the degradation indicator according to the battery model, and determining whether there is significant bias in the prediction error inherent for each sample battery;

a first correlation determining step of using the training data to construct a first error prediction model associating an explanatory variable defined on a basis of the first input parameters with an objective variable corresponding to a predicted value of the prediction error acquired in the error trend determining step, and determining whether a first correlation exists between the measured value of the prediction error and the predicted value of the prediction error according to the first error prediction model; and a first reconstruction step of reconstructing the battery model in a case where it is determined in the error trend determining step that there is the significant bias and it is determined in the first correlation determining step that the first correlation exists.

2. The battery model construction method according to claim 1, further comprising:

a second correlation determining step of using the training data to construct a second error prediction model associating an explanatory variable defined on a basis of the second input parameters with an objective variable corresponding to a predicted value of the prediction error, and determining whether a second correlation exists between the measured value of the prediction error acquired in the error trend determining step and the predicted value of the prediction error according to the second error prediction model; and a second reconstruction step of reconstructing the battery model in the case where it is determined in the error trend determining step that there is the significant bias and it is determined in the second correlation determining step that the second correlation exists.

3. The battery model construction method according to claim 2, wherein the first input parameters are usage history parameters defined on a basis of time series data about a current, a voltage, and a temperature of the battery, and the second input parameters are manufacturing history parameters defined on a basis of data from a time of manufacture of the battery.

4. The battery model construction method according to claim 3, wherein in the first reconstruction step, the battery model is reconstructed by using the first error prediction model.

5. The battery model construction method according to claim 4, wherein in the second reconstruction step, the battery model is reconstructed by using the second error prediction model.

6. The battery model construction method according to claim 3, wherein in the second reconstruction step, the battery model is reconstructed by using the second error prediction model.

7. The battery model construction method according to claim 5, wherein the time series data related to measured values of the first and second input parameters and the degradation indicator acquired in the data acquiring step is divided into the training data that belongs to a prescribed training period and verification data that belongs to a verification period subsequent to the training period, and in the error trend determining step, the presence or absence of the significant bias is determined on a basis of an evaluation result, for each sample battery, regarding a distribution of the prediction error in the training period and an evaluation result regarding a correlation between the prediction error in the training period and the prediction error in the verification period.

8. The battery model construction method according to claim 5, further comprising:

a third reconstruction step of reconstructing the battery model by adding an offset term that outputs a constant value according to a cumulative use time of the battery in the case where it is determined in the error trend determining step that there is the significant bias and it is determined in the first and second correlation determining steps that neither the first nor the second correlation exists.

9. The battery model construction method according to claim 4, wherein the time series data related to measured values of the first and second input parameters and the degradation indicator acquired in the data acquiring step is divided into the training data that belongs to a prescribed training period and verification data that belongs to a verification period subsequent to the training period, and in the error trend determining step, the presence or absence of the significant bias is determined on a basis of an evaluation result, for each sample battery, regarding a distribution of the prediction error in the training period and an evaluation result regarding a correlation between the prediction error in the training period and the prediction error in the verification period.

10. The battery model construction method according to claim 4, further comprising:

a third reconstruction step of reconstructing the battery model by adding an offset term that outputs a constant value according to a cumulative use time of the battery in the case where it is determined in the error trend determining step that there is the significant bias and it is determined in the first and second correlation determining steps that neither the first nor the second correlation exists.

11. The battery model construction method according to claim 3, wherein the time series data related to measured values of the first and second input parameters and the degradation indicator acquired in the data acquiring step is divided into the training data that belongs to a prescribed training period and verification data that belongs to a verification period subsequent to the training period, and in the error trend determining step, the presence or absence of the significant bias is determined on a basis of an evaluation result, for each sample battery, regarding a distribution of the prediction error in the training period and an evaluation result regarding a correlation between the prediction error in the training period and the prediction error in the verification period.

12. The battery model construction method according to claim 3, further comprising:

a third reconstruction step of reconstructing the battery model by adding an offset term that outputs a constant value according to a cumulative use time of the battery in the case where it is determined in the error trend determining step that there is the significant bias and it is determined in the first and second correlation determining steps that neither the first nor the second correlation exists.

13. A battery degradation prediction device comprising:
a processor configured to:
acquire each value of a plurality of first input parameters and a plurality of second input parameters correlated with a degradation indicator for a battery; and
calculate a predicted value of the degradation indicator by inputting the values of the first and second input parameters into a battery model constructed according to the battery model construction method according to claim 3.

14. A battery degradation prediction device comprising:
a processor configured to:
acquire each value of a plurality of first input parameters and a plurality of second input parameters correlated with a degradation indicator for a battery; and
calculate a predicted value of the degradation indicator by inputting the values of the first and second input parameters into a battery model constructed according to the battery model construction method according to claim 1.

15. A battery degradation prediction device comprising:
a processor configured to:
acquire each value of a plurality of first input parameters and a plurality of second input parameters correlated with a degradation indicator for a battery; and
calculate a predicted value of the degradation indicator by inputting the values of the first and second input parameters into a battery model constructed according to the battery model construction method according to claim 2.

* * * * *